(12) United States Patent
Kim (10) Patent No.: US 8,295,781 B2
(45) Date of Patent: Oct. 23, 2012

(54) TRANSCEIVER HAVING MULTISTAGE CHANNEL FILTER IN WIRELESS COMMUNICATION SYSTEM

(75) Inventor: Byung-Ki Kim, Hwaseong-si (KR)

(73) Assignee: Samsung Electronics Co., Ltd (KR)

( * ) Notice: Subject to any disclaimer, the term of this patent is extended or adjusted under 35 U.S.C. 154(b) by 327 days.

(21) Appl. No.: 12/581,588

(22) Filed: Oct. 19, 2009

(65) Prior Publication Data

US 2010/0098190 A1  Apr. 22, 2010

(30) Foreign Application Priority Data

Oct. 17, 2008  (KR) .................. 10-2008-0101979

(51) Int. Cl.
*H04B 1/38*  (2006.01)
(52) U.S. Cl. ............. 455/73; 455/84; 375/295; 708/300
(58) Field of Classification Search .............. 455/73, 455/84; 375/295, 350; 708/290, 300
See application file for complete search history.

(56) References Cited

U.S. PATENT DOCUMENTS 7,616,720 B2 * 11/2009 Al-Adnani .................. 375/350
7,680,869 B2 *  3/2010 Chiskis ....................... 708/313
2004/0205827 A1  10/2004 Krone
2004/0260737 A1 * 12/2004 Van Den Enden et al. ... 708/300
2005/0031046 A1   2/2005 Al-Adnani
2005/0085237 A1   4/2005 Yang et al.

FOREIGN PATENT DOCUMENTS
WO   WO 03/049395   6/2003

OTHER PUBLICATIONS

C.Y. Fung et al., "A Multistage Filterbank-based Channelizer and its Multiplier-less Realization", IEEE ISCAS, 2002.*
C.Y. Fung et al., "A Multistage filterbank-based Channelizer and its Multiplier-less Realization", IEEE ISCAS, 2002.

* cited by examiner

*Primary Examiner* — Nay A. Maung
*Assistant Examiner* — Angelica Perez
(74) *Attorney, Agent, or Firm* — The Farrell Law Firm, P.C.

(57) ABSTRACT

A transceiver having a multistage channel filter for a wireless communication system is disclosed. The transceiver is composed of a transmitter unit including a multistage channel filter module to perform channel filtering on an input signal having a sampling rate corresponding to a channel bandwidth of the wireless communication system by means of sampling-rate conversion through multiple stages, and a receiver unit corresponding to the transmitter unit.

4 Claims, 11 Drawing Sheets

TRANSCEIVER HAVING MULTISTAGE CHANNEL FILTER IN WIRELESS COMMUNICATION SYSTEM

PRIORITY

This application claims priority to an application entitled "TRANSCEIVER HAVING MULTISTAGE CHANNEL FILTER IN WIRELESS COMMUNICATION SYSTEM" filed in the Korean Intellectual Property Office on Oct. 17, 2008 and assigned Serial No. 10-2008-0101979, the contents of which are incorporated herein by reference.

BACKGROUND OF THE INVENTION

1. Field of the Invention

The present invention relates generally to a transceiver of a wireless communication system and, more particularly, to a transceiver having a multistage channel filter in a wireless communication system.

2. Description of the Related Art

The Long Term Evolution (LTE) specification of the 3rd Generation Partnership Project (GPP) defines multiple channel bandwidths including 20, 15, 10, 5, 3 and 1.4 MHz, and requires support for these channel bandwidths.

For multiple channel bandwidths in LTE, a transmitter unit (Tx) must satisfy very stringent requirements, including spectral masking. A receiver unit (Rx) must also satisfy very stringent requirements including high levels of adjacent channel selectivity and channel blocking with regard to interference signals from adjacent channels.

It may be highly uncompetitive to develop and employ separate transceivers for individual channel bandwidths in consideration of many nations and network operators. Hence, in practical situations, Radio Frequency (RF) filters and analog Intermediate Frequency (IF) filters are to be designed in accordance with the widest channel bandwidth of 20 MHz. At the same time, these RF filters and analog IF filters are adapted through digital channel filters to support the narrower channel bandwidths provided in the LTE specification and requirements of various nations and/or operators.

A digital channel filter may perform very steep filtering at the edge of a channel bandwidth, which may be difficult to achieve using an analog channel filter.

As the channel bandwidth narrows, the number of taps required in a digital channel filter increases. For example, the number of filter taps (i.e., coefficients) required for 5 to 1.4 MHz may be four to eight times that of the number of filter taps required for 20 MHz. Implementing a digital channel filter having a large number of taps requires a large number of multipliers. The multiplier is one of the most complex computational components in digital hardware. Therefore, it may be not advantageous to implement a digital channel filter using a large number of multipliers.

SUMMARY OF THE INVENTION

The present invention has been made in view of the above problems, and provides a channel filter for a radio transceiver that has a reduced number of filter taps by means of multistage filtering.

The present invention also provides a transceiver that supports multiple channel bandwidths in a single system.

In accordance with an embodiment of the present invention, there is provided a transmitter unit for a wireless communication system, the transmitter unit including a multistage channel filter module for performing channel filtering on an input signal having a sampling rate corresponding to a channel bandwidth of the wireless communication system by performing a sampling-rate conversion through multiple stages.

The multistage channel filter module may include at least one decimator for downsampling the input signal according to the channel bandwidth, at least one zero-padder for interpolating the downsampled signal according to the channel bandwidth, and at least one channel filter for channel-filtering the downsampled signal or interpolated signal.

The transmitter unit may further include a channel filter adjuster for changing the number and arrangement of decimators, zero-padders and channel filters according to the channel bandwidth.

In accordance with another embodiment of the present invention, there is provided a receiver unit for a wireless communication system, the receiver unit including a multistage channel filter module for performing channel filtering on an input signal having a sampling rate corresponding to a channel bandwidth of the wireless communication system by means of sampling-rate conversion through multiple stages.

The multistage channel filter module may include at least one decimator for downsampling the input signal according to the channel bandwidth, at least one zero-padder for interpolating the downsampled signal according to the channel bandwidth, and at least one channel filter for channel-filtering the downsampled signal or interpolated signal.

The receiver unit may further include a channel filter adjuster to change the number and arrangement of decimators, zero-padders and channel filters according to the channel bandwidth.

According to the present invention, for a system supporting multiple channel bandwidths, the channel filter can be effectively adapted according to the channel bandwidth in use. In particular, the multistage channel filter can prevent a rapid increase in the number of multipliers necessary to perform channel filtering for narrower channel bandwidths.

BRIEF DESCRIPTION OF THE DRAWINGS

The features and advantages of the present invention will be more apparent from the following detailed description in conjunction with the accompanying drawings, in which.

DETAILED DESCRIPTION OF EMBODIMENTS

Hereinafter, embodiments of the present invention are described in detail with reference to the accompanying drawings. The same reference symbols are used throughout the drawings to refer to the same or like parts. Detailed descriptions of well-known functions and structures incorporated herein may be omitted to avoid obscuring the subject matter of the present invention.

Figure 1:
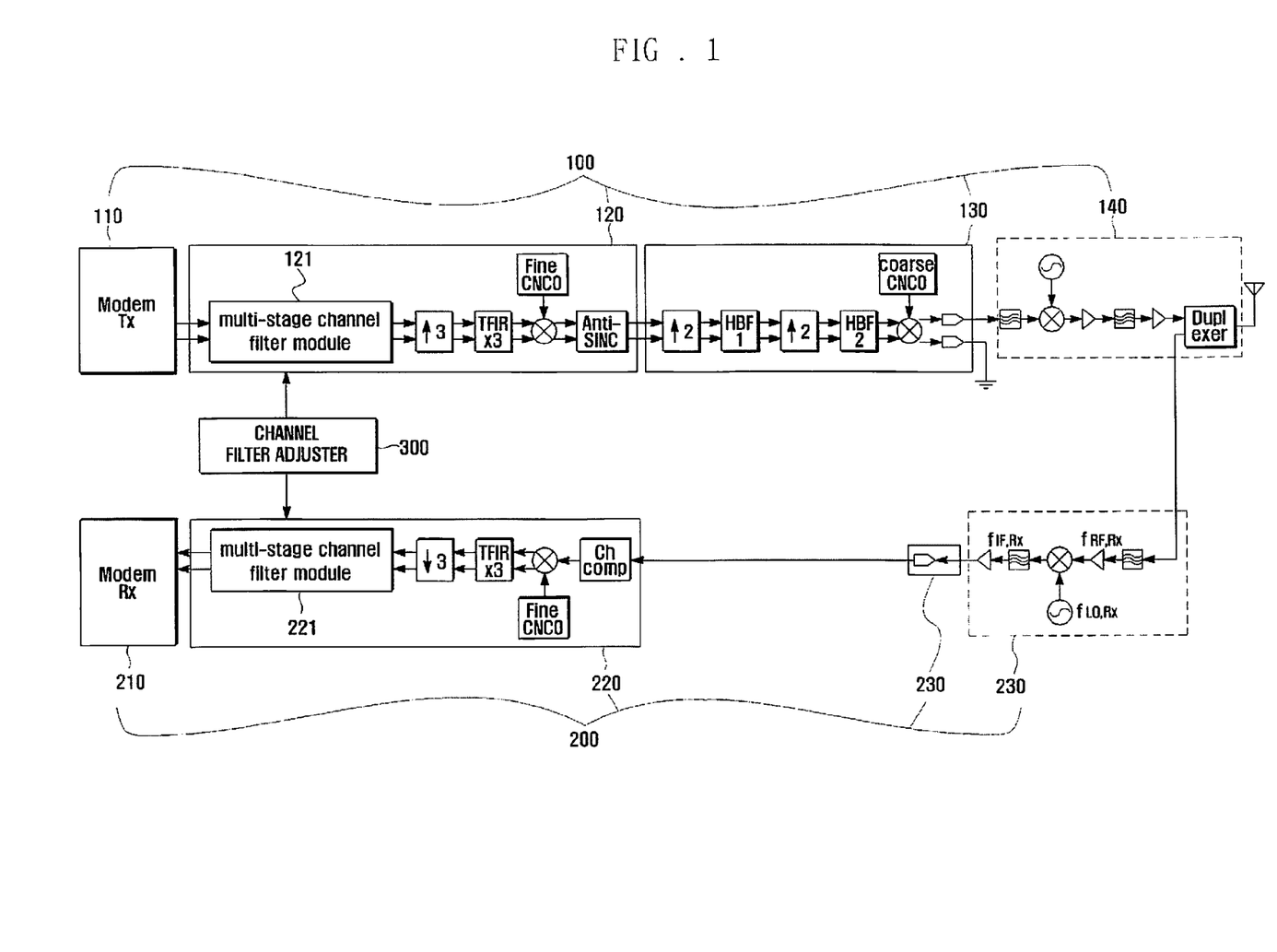
FIG. 1 is a block diagram of a transceiver according to an embodiment of the present invention.

FIG. 1 is a block diagram of a transceiver according to an embodiment of the present invention.

Referring to FIG. 1, the transceiver includes a transmitter unit 100, receiver unit 200, and channel filter adjuster 300.

The transmitter unit 100 includes a transmit modem 110, Digital UpConverter (DUC) 120, digital to analog converter (DAC) 130, and Radio Frequency (RF) transmitter 140.

The receiver unit 200 includes a receive modem 210, a Digital DownConverter (DDC) 220, an Analog-to-Digital Converter (ADC) 230, and an RF receiver 240.

In the transmitter unit 100, the transmit modem 110 produces a digital baseband signal. The baseband signal has a preset sampling rate according to the system channel bandwidth.

The DUC 120 applies digital channel filtering to a baseband signal from the transmit modem 110, and converts the baseband signal into an Intermediate Frequency (IF) signal (i.e., performs frequency shifting). For digital filtering, the DUC 120 includes a multistage channel filter module 121, which performs channel filtering through sampling-rate conversion in multiple stages.

The DAC 130 converts a digital IF signal from the DUC 120 into an analog IF signal through digital-to-analog conversion.

The RF transmitter 140 converts an IF signal from the DAC 130 into an RF signal, and transmits the RF signal through an antenna.

In the receiver unit 200, the RF receiver 240 receives an RF signal, and converts the RF signal into an analog IF signal. The ADC 230 converts an analog IF signal from the RF receiver 240 into a digital IF signal through analog-to-digital conversion.

The DDC 220 converts an IF signal from the ADC 230 into a baseband signal through frequency shifting, and outputs the baseband signal to the receive modem 210 through digital channel filtering.

The DUC 120 may perform anti-image filtering for removing image signals after upsampling, and the DDC 220 may perform anti-alias filtering prior to downsampling.

In particular, each of the DUC 120 and DDC 220 includes a channel filter module, which is composed of channel filters for filtering digital signals such as a baseband signal and IF signal. A digital channel filter in the DUC 120 or DDC 220 performs very steep filtering at the edge of a channel bandwidth, which is not easy to realize using an analog channel filter.

As the system frequency bandwidth becomes narrower, the number of taps required in a digital channel filter increases. For example, the number of filter taps (i.e., coefficients) required for 5 to 1.4 MHz may be four to eight times that for 20 MHz. The number of multipliers required to realize a digital channel filter is directly proportional to the number of filter taps.

The multiplier is one of the most complex computational components in digital hardware. In the present invention, in order to reduce the number of multipliers required, a multistage channel filter is employed.

According to an embodiment of the present invention, the multistage channel filter module 121 of the DUC 120 performs channel filtering on an input signal according to a given channel bandwidth through multistage downsampling and interpolation, thereby reducing the necessary number of multipliers.

Similarly to the DUC 120, the multistage channel filter module 221 of the DDC 220 performs channel filtering on an input signal through multistage downsampling and interpolation, thereby reducing the necessary number of multipliers.

In down sampling or decimation, some samples in a given input signal are retained. In interpolation, uniformly spaced new samples are inserted between each pair of consecutive input samples.

The frequency of downsampling and interpolation may vary according to the channel bandwidth. Table 1 provides some information regarding factors for downsampling and interpolation.

TABLE 1

| Sample rate (MSPS) | Channel bandwidth | Down sampling factor |
|---|---|---|
| 30.72 | 20 MHz | 1 |
| 15.36 (30.72/2) | 10 MHz | ½ |
| 7.68 (30.72/4) | 5 MHz | ¼ |
| 3.84 (30.72/8) | 3 MHz | ⅛ |
| 1.92 (30.72/16) | 1.4 MHz | 1/16 |

As shown in Table 1, the downsampling factor may vary according to the channel bandwidth. Downsampling may be performed through a single stage or through multiple stages. For example, downsampling by a factor of ¼ may be performed through two stages of downsampling by a factor of ½. Interpolation may also be performed through a single stage or through two or more stages.

Performing downsampling and interpolation requires a decimator, a zero-padder and a digital channel filter. The each of the DUC 120 and DDC 220 include a digital channel filter and may be realized using a Field-Programmable Gate Array (FPGA). The FPGA is a semiconductor device including programmable logic blocks and programmable wire segments. The programmable logic blocks may include flip-flops or memory blocks.

The channel filter adjuster 300 adjusts the DUC 120 and DDC 220 according to channel bandwidths in use, by changing the number of and the sequence of decimators, zero-padders and digital channel filters constituting the DUC 120 and DDC 220, according to a selected frequency bandwidth of 20, 10, 5, 3 or 1.4 MHz.

According to an embodiment of the present invention, in order to support various channel bandwidths of 20, 10, 5, 3 and 1.4 MHz, the transmit modem 110 and receive modem 210 may change the number of resource blocks necessary for data being sent or received.

In particular, the channel filter adjuster 300 changes the number and the sequence of decimators, zero-padders and digital channel filters constituting the DUC 120 and DDC 220.

Figure 2:
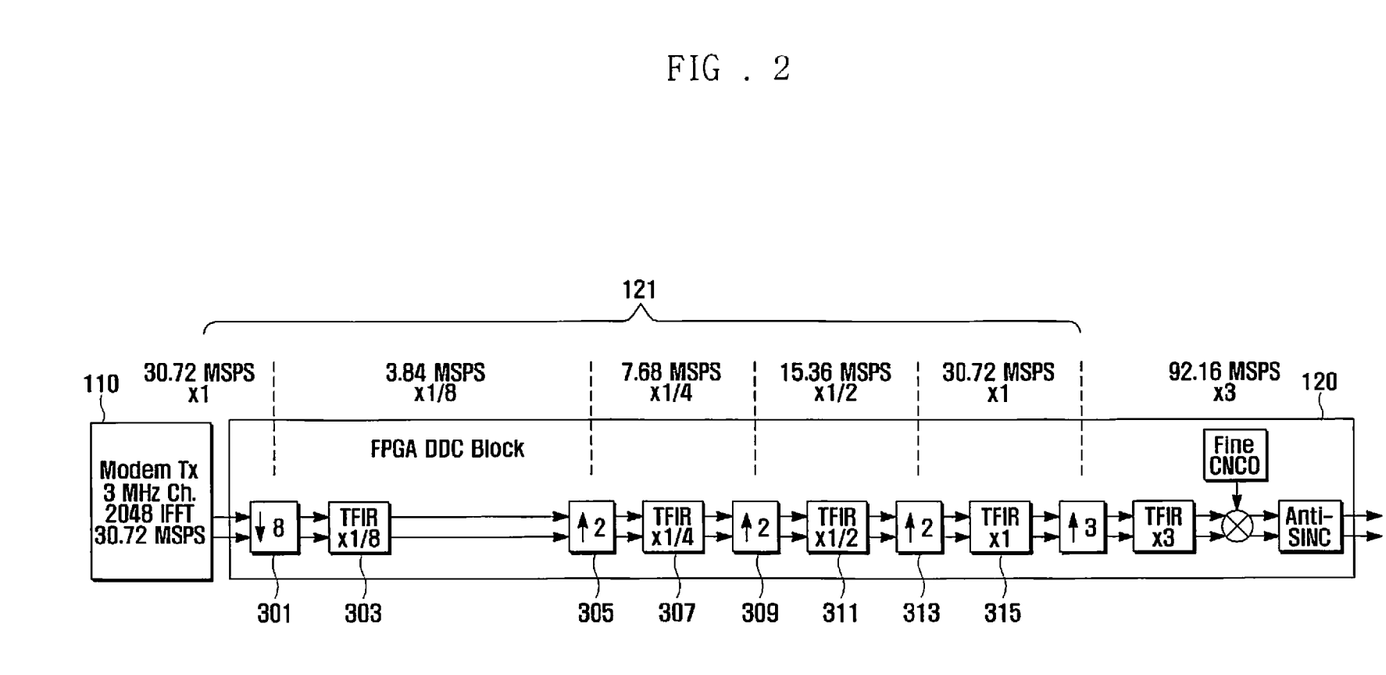
FIG. 2 is a block diagram illustrating a transmit modem and digital up converter for a transmitter unit in the transceiver of FIG. 1.
Figure 3:
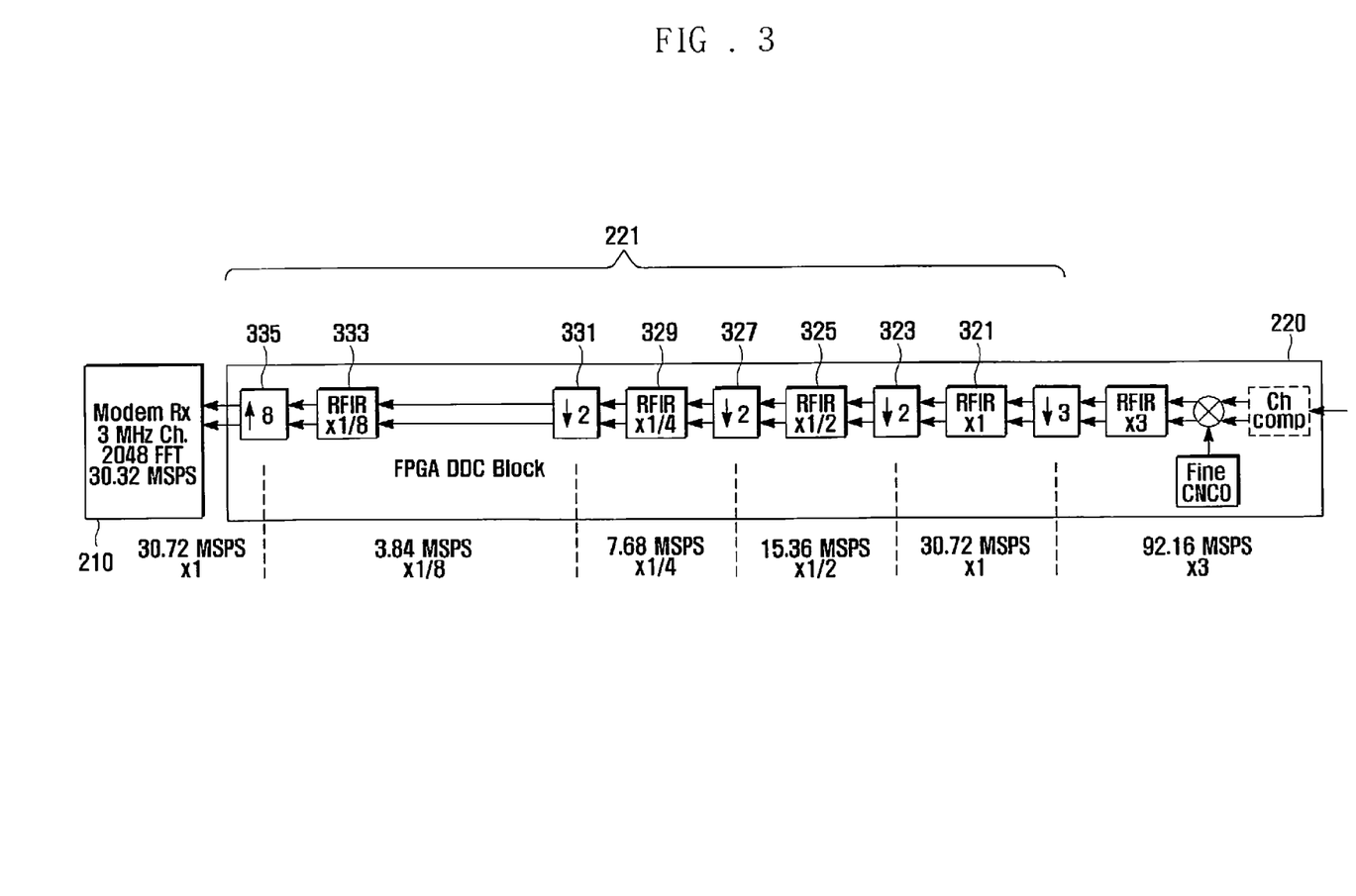
FIG. 3 is a block diagram illustrating a digital down converter and receive modem for a receiver unit in the transceiver of FIG. 1.

FIGS. 2 and 3 depict multistage channel filters according to an embodiment of the present invention. In FIGS. 2 and 3, the channel bandwidth is assumed to be 3 MHz.

In FIG. 2, the transmit modem 110 and DUC 120, which includes the multistage channel filter module 121, of FIG. 1 are illustrated. The input signal from the transmit modem 110 to the DUC 120 has a sampling rate of 30.72 Mega Samples Per Second (MSPS). The input signal to the multistage channel filter module 121 of the DUC 120 has a sampling rate of 30.72 MSPS.

The input signal fed to the multistage channel filter module 121 passes through a decimator 301 with a factor of ⅛, a channel filter 303 with a factor of ⅛, a zero-padder 305 with a factor of ¼, a channel filter 307 with a factor of ¼, a zero-padder 309 with a factor of ½, a channel filter 311 with a factor of ½, a zero-padder 313 with a factor of 1, and a channel filter 315 with a factor of 1, and is output as a signal having the original sampling rate.

More specifically, multistage channel filtering is carried out through four stages. At the first stage, the source input signal having a sampling rate of 30.72 MSPS is down-sampled by a factor of 8 through the decimator 301 into a 3.84 MSPS signal (⅛ of the source input sampling rate), and the down-sampled signal is low-pass filtered through the channel filter 303.

At the second stage, the 3.84 MSPS signal from the first stage is interpolated by a factor of 2 through the zero-padder 305 into a 7.68 MSPS signal (¼ of the source input sampling rate), and the interpolated signal is low-pass filtered through the channel filter 307. Here, the zero-padder 305 inserts uniformly spaced new samples between each pair of consecutive samples in the input signal of 3.84 MSPS for interpolation by a factor of 2.

At the third stage, the signal 7.68 MSPS signal from the second stage is interpolated by a factor of 2 through the zero-padder 309 into a 15.36 MSPS signal (½ of the source input sampling rate), and the interpolated signal is low-pass filtered through the channel filter 311. Here, the zero-padder 309 inserts uniformly spaced new samples between each pair of consecutive samples in the input signal of 7.68 MSPS for interpolation by a factor of 2.

At the fourth stage, the 15.36 MSPS signal from third stage is interpolated by a factor of 2 through the zero-padder 313 into a 30.72 MSPS signal (the same sampling rate as the source input sampling rate), and the interpolated signal is low-pass filtered through the channel filter 315. Here, the zero-padder 313 inserts uniformly spaced new samples between each pair of consecutive samples in the input signal of 15.36 MSPS for interpolation by a factor of 2.

As described above, the multistage channel filter module 121 may include at least one decimator (for example, the decimator 301) for downsampling a source input signal, and at least one zero-padder (for example, zero-padders 305, 309 and 313) for interpolating the down-sampled signal to recover the source input signal. The multistage channel filter module 121 may further include a channel filter (for example, a channel filter 303) for channel filtering a downsampled signal, and another channel filter (for example, channel filters 307, 311 and 315) for channel filtering a signal interpolated by a zero-padder.

In FIG. 3, the receive modem 210 and DDC 220, which includes a multistage channel filter module 221, of the receiver unit 200 of FIG. 1 are illustrated. The signal input from the ADC 230 to the DDC 220 has a sampling rate of 92.16 MSPS. The DDC 220 performs down conversion and channel filtering on the input signal, and outputs a 30.72 MSPS signal to the multistage channel filter module 221.

The input signal fed to the multistage channel filter module 221 passes through a channel filter 321 with a factor of 1, a decimator 323 with a factor of ½, a channel filter 325 with a factor of ½, a decimator 327 with a factor of ¼, a channel filter 329 with a factor of ¼, a decimator 331 with a factor of ⅛, a channel filter 333 with a factor of ⅛, and a zero-padder 335 with a factor of 1, and is output as a signal having the original sampling rate to the receive modem 210.

More specifically, multistage channel filtering is carried out through the following four stages.

At the first stage, the source input signal having a sampling rate of 30.72 MSPS is low-pass filtered through the channel filter 321, and is down-sampled by a factor of 2 through the decimator 323 into a 15.36 MSPS signal (½ of the source input sampling rate).

At the second stage, the 15.36 MSPS signal from the first stage is low-pass filtered through the channel filter 325, and is down-sampled by a factor of 2 through the decimator 327 into a signal 7.68 MSPS signal (¼ of the source input sampling rate).

At the third stage, the 7.68 MSPS signal from the second stage is low-pass filtered through the channel filter 329, and is downsampled by a factor of 2 through the decimator 331 into a 3.84 MSPS signal (⅛ of the source input sampling rate).

At the fourth stage, the signal 3.84 MSPS signal from the third stage is low-pass filtered through the channel filter 333, and is interpolated by a factor of 8 through the zero-padder 335 into a 30.72 MSPS signal (the same as the source input sampling rate). Here, the zero-padder 335 inserts uniformly spaced new samples between each pair of consecutive samples in the input signal of 3.84 MSPS for interpolation by a factor of 8.

The multistage channel filter module 221 may include at least one decimator (for example, decimators 323, 327 and 331) for downsampling a source input signal, and at least one zero-padder (for example, zero-padder 335) for interpolating the down-sampled signal to recover the source input signal. The multistage channel filter module 121 may further include at least one first channel filter (for example, channel filters 325, 329 and 333) for channel filtering a down-sampled signal.

The multistage channel filter module 121 may further include a second channel filter (for example, channel filter 307, 311 or 315) for channel filtering a signal interpolated by a zero-padder, and a third channel filter (for example, channel filter 321) for channel filtering the source input signal.

Unlike an existing channel filter that filters a source input signal without processing, the channel filter of the present invention performs filtering after downsampling or interpolation in multiple stages.

For channel bandwidths of 10, 5, 3 and 1.4 MHz, channel filtering may be carried out in multiple stages using a plurality of channel filters, zero-padders and decimators. For example, when the channel bandwidth is set to 20, 10, 5, 3 and 1.4 MHz, the number of stages becomes 1, 2, 3, 4 and 5, respectively.

In comparison to single-stage filtering, multistage filtering according the present invention requires fewer filter taps and can be realized using fewer multipliers.

FIGS. 4 to 8 depict channel filter characteristics for a 3 MHz channel bandwidth at the transmitter unit.

Figure 4:
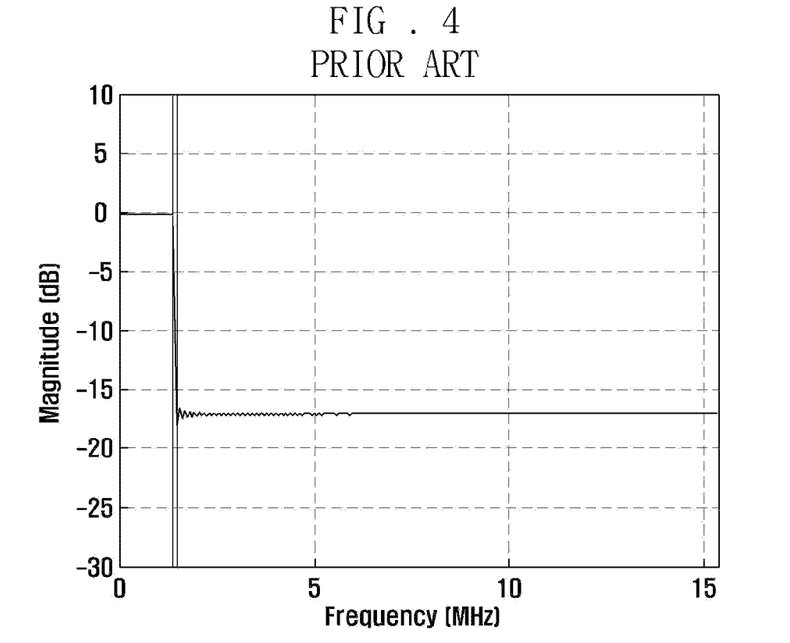
FIG. 4 is a plot of a frequency response of a single-stage channel filter for a 3 MHz channel bandwidth at a transmitter unit.
Figure 5:
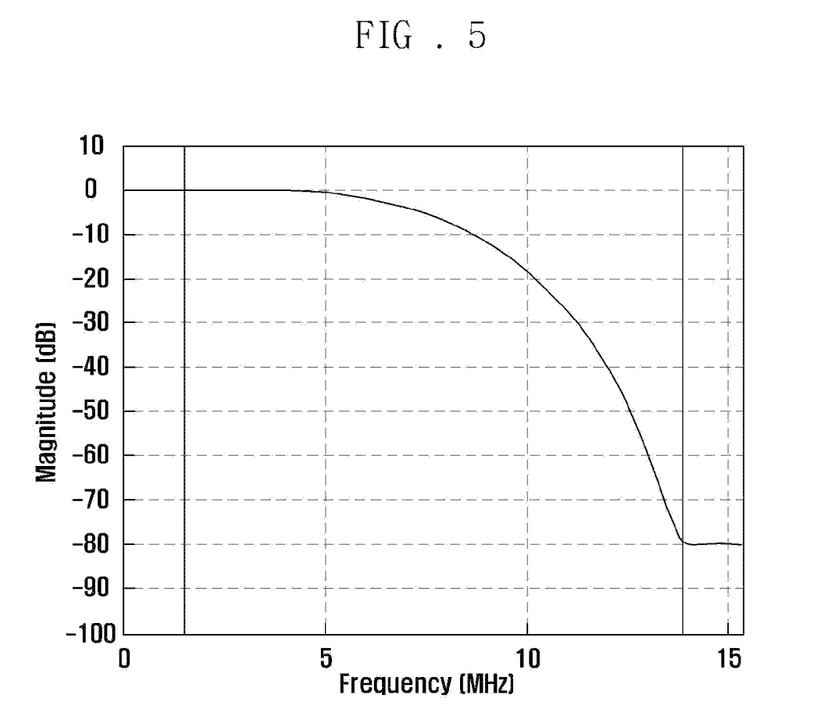
FIG. 5 is a plot of a frequency response of a channel filter with a factor of 1 constituting a multistage filter for a 3 MHz channel bandwidth at the transmitter unit.
Figure 6:
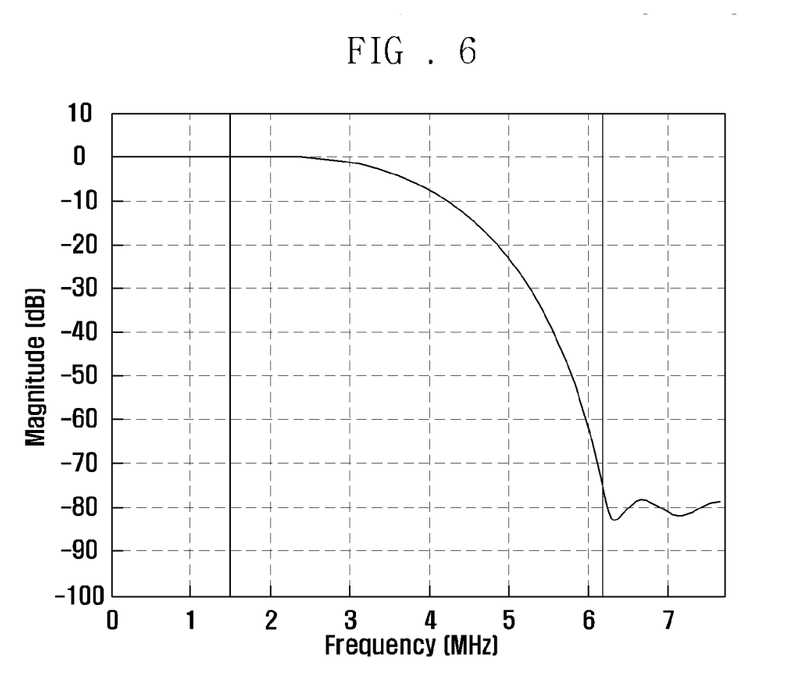
FIG. 6 is a plot of a frequency response of a channel filter with a factor of ½ constituting the multistage filter.
Figure 7:
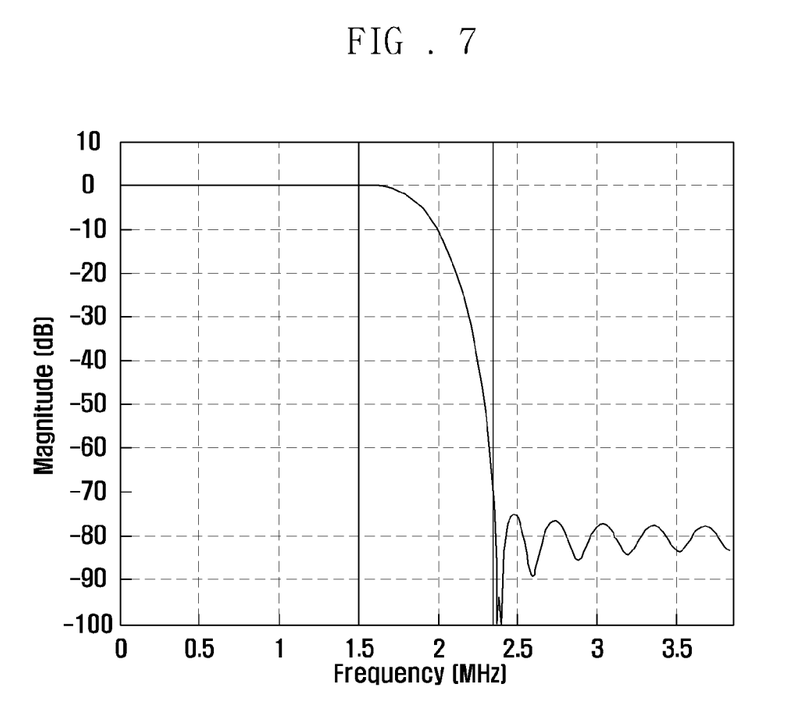
FIG. 7 is a plot of a frequency response of a channel filter with a factor of ¼ constituting the multistage filter.
Figure 8:
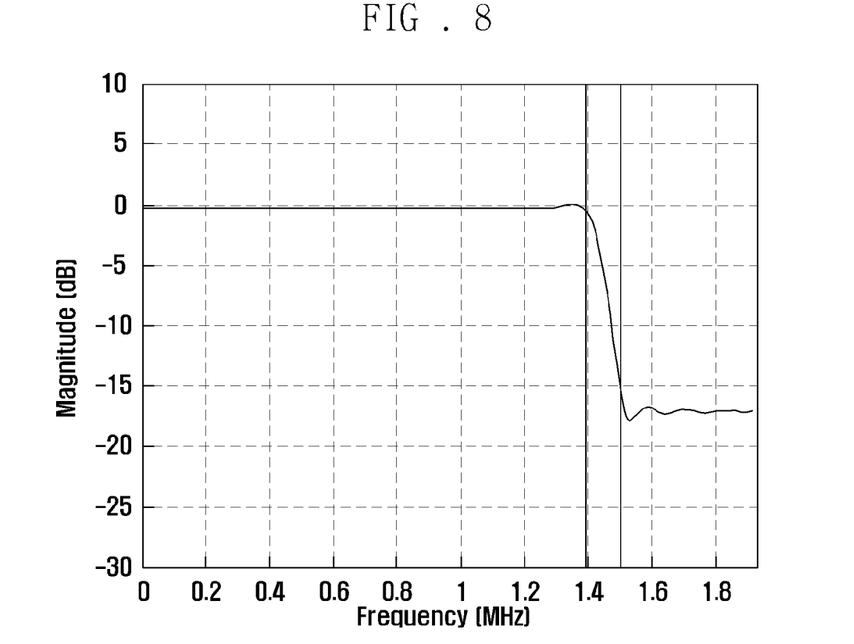
FIG. 8 is a plot of a frequency response of a channel filter with a factor of ⅛ constituting the multistage filter.

FIG. 4 shows a plot of the frequency response for a single-stage channel filter, and FIGS. 5 to 8 show plots of frequency responses for a multistage channel filter according to an embodiment of the present invention. In particular, FIG. 5 illustrates the frequency response of the channel filter 315 with a factor of 1, FIG. 6 illustrates the frequency response of the channel filter 311 with a factor of ½, FIG. 7 illustrates the frequency response of the channel filter 307 with a factor of ¼, and FIG. 8 illustrates the frequency response of the channel filter 303 with a factor of ⅛.

For a 3 MHz channel bandwidth at the transmitter unit, channel filtering may be realized using a single-stage channel filter having a frequency response as shown in FIG. 4. 481 taps are required for the single-stage channel filter.

As described in connection with FIG. 2, channel filtering may be realized using a multistage channel filter composed of four channel filters having frequency responses as shown in FIGS. 5 to 8.

When the multistage channel filter is implemented using the channel filters 303, 307 and 315 and the zero-padder 309, the number of required filter taps is reduced to 130. As a result, the number of required multipliers can be reduced.

The channel filter 315 with a factor of 1, the channel filter 311 with a factor of ½ and the channel filter 307 with a factor of ¼ may be designed to have half-band filter characteristics, as described in connection with FIGS. 9 and 10.

Figure 9:
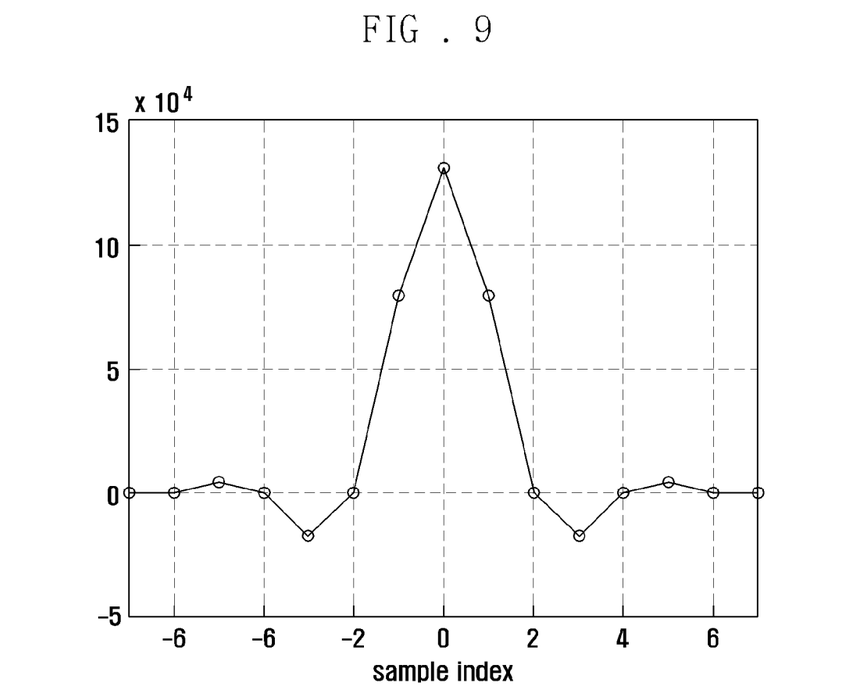
FIG. 9 is a plot of a time domain response of a half-band filter.
Figure 10:
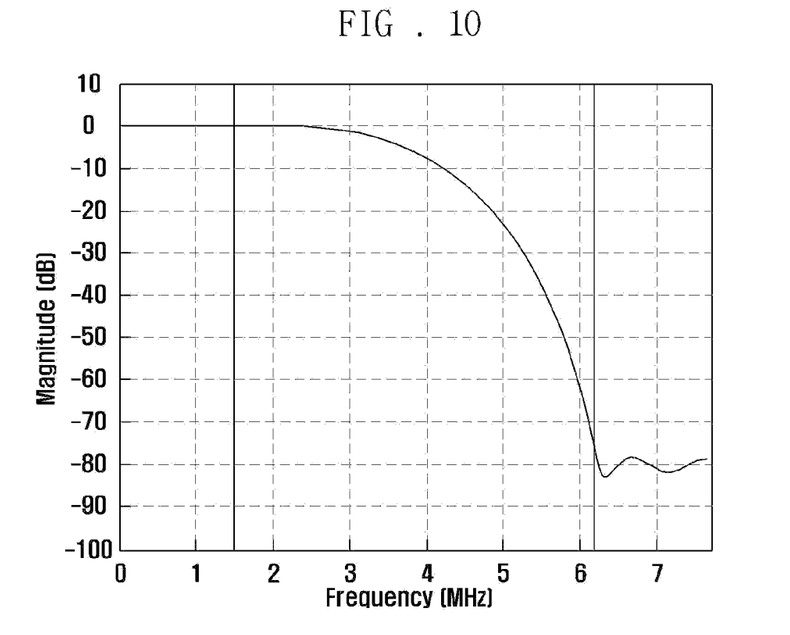
FIG. 10 is a plot of a frequency domain response of the half-band filter.

FIG. 9 is a plot of the time domain response of a half-band filter, and FIG. 10 is a plot of the frequency domain response of the half-band filter according to an embodiment of the present invention.

As shown in FIG. 9, for a 3 MHz channel bandwidth, filter coefficients for the channel filter are −595, 0, 4270, 0, −17493, 0, 79337, 131071, 79337, 0, −17493, 0, 4270, 0 and −595. Except for central values (79337, 131071, 79337), one of every two coefficients is zero. Therefore, the number of multipliers necessary for realizing the channel filter may be reduced by about 50 percent.

For example, for a 3 MHz channel bandwidth, whereas 481 filter taps and 481 multipliers are necessary for the single-stage channel filter, only 130 filter taps and 100 multipliers are necessary for the multistage channel filter. Hence, the number of multipliers can be reduced by 79 percent.

FIGS. 11 to 15 depict channel filter characteristics for a 3 MHz channel bandwidth at the receiver unit.

Figure 11:
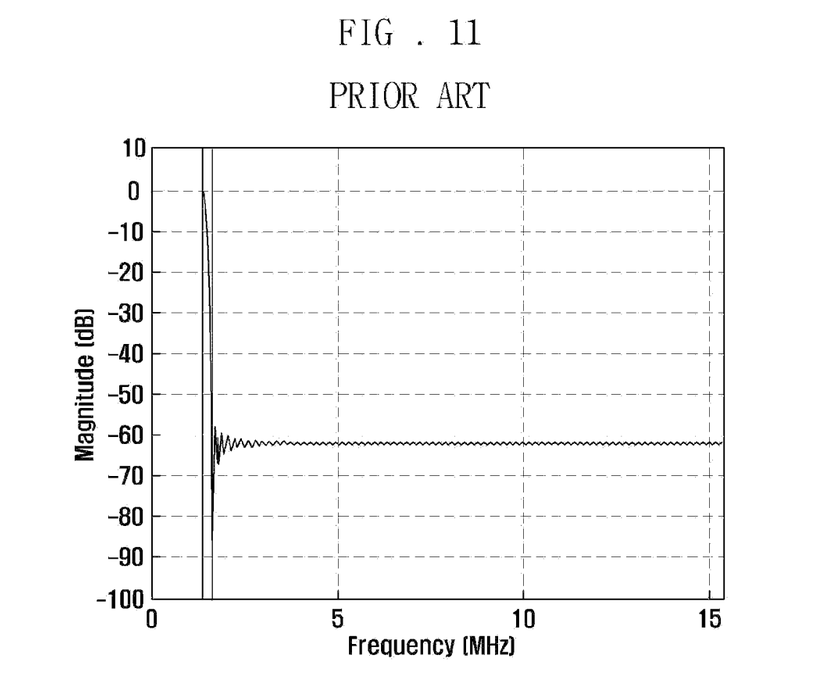
FIG. 11 is a plot of a frequency response of a single-stage channel filter for a 3 MHz channel bandwidth at a receiver unit.
Figure 12:
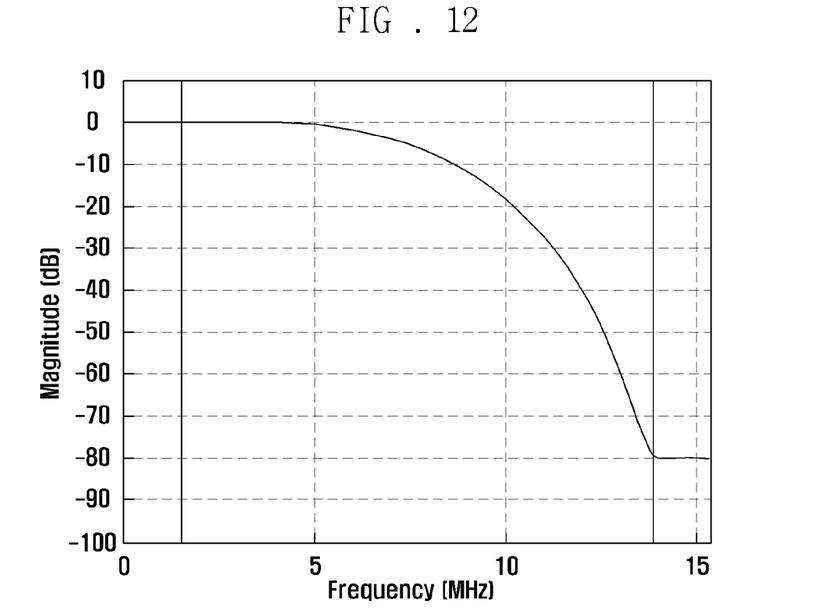
FIG. 12 is a plot of a frequency response of a channel filter with a factor of 1 constituting a multistage filter for a 3 MHz channel bandwidth at the receiver unit.
Figure 13:
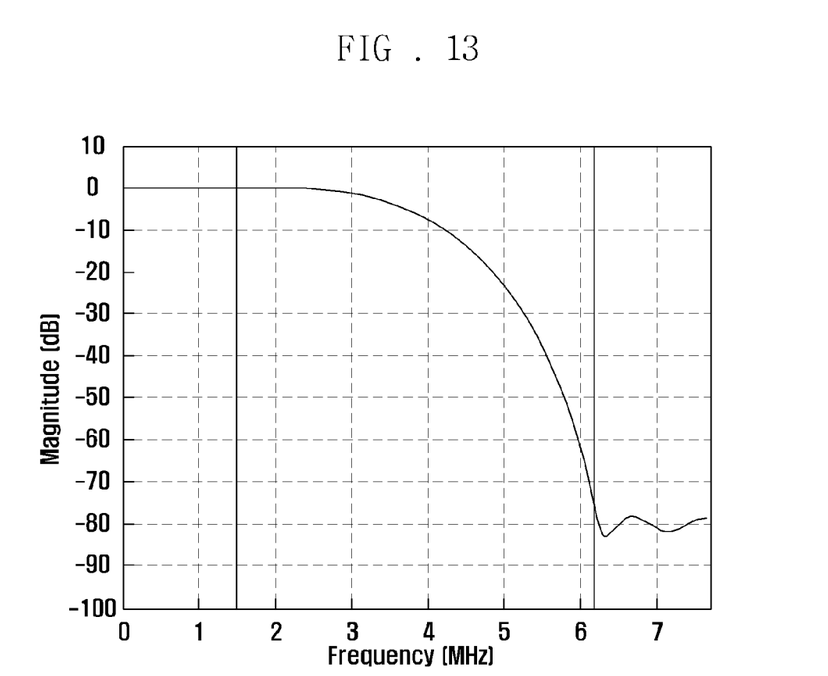
FIG. 13 is a plot of a frequency response of a channel filter with a factor of ½ constituting the multistage filter.
Figure 14:
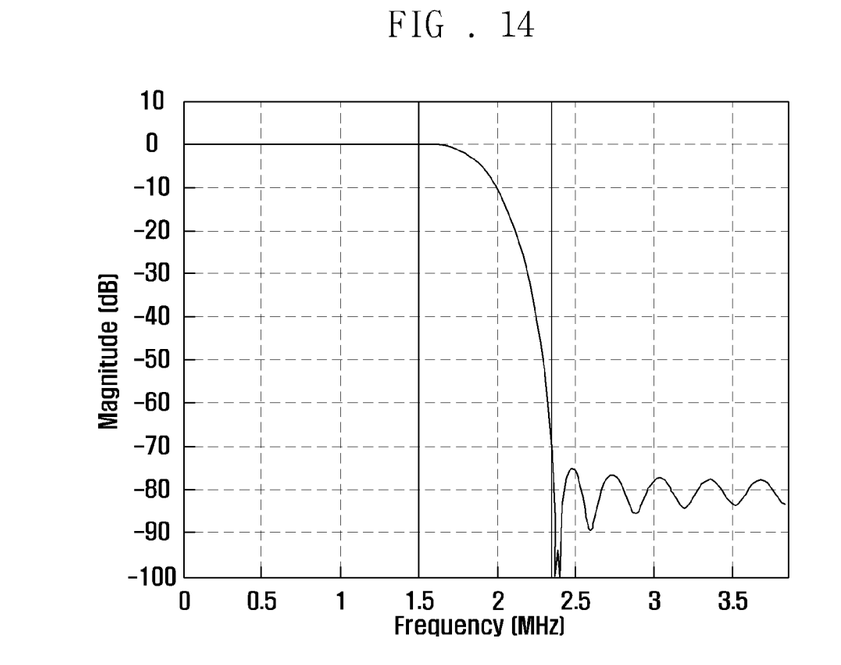
FIG. 14 is a plot of a frequency response of a channel filter with a factor of ¼ constituting the multistage filter.
Figure 15:
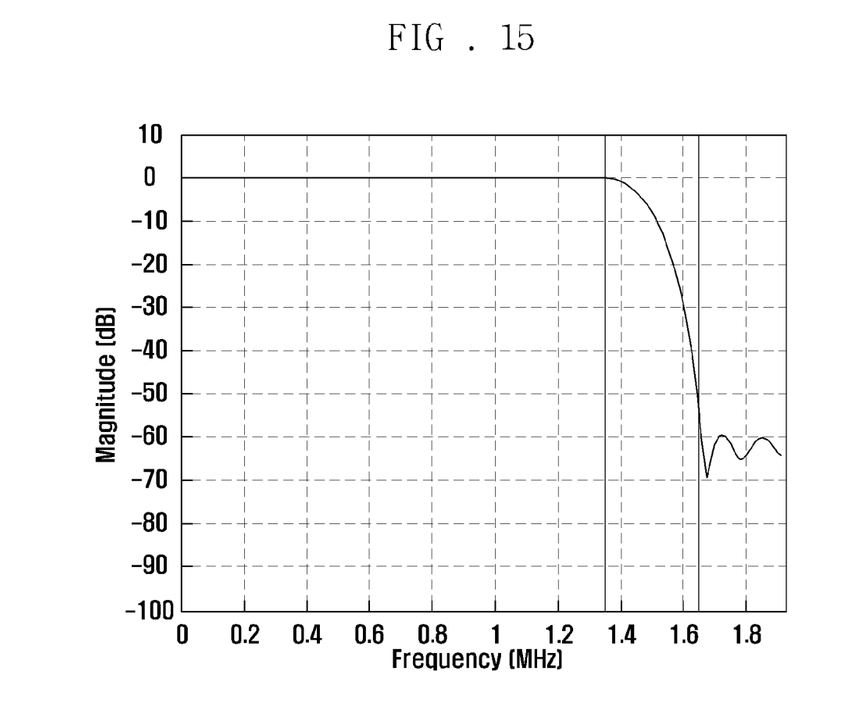
FIG. 15 is a plot of a frequency response of a channel filter with a factor of ⅛ constituting the multistage filter.

FIG. 11 shows a plot of the frequency response for a single-stage channel filter, and FIGS. 12 to 15 show plots of frequency responses for a multistage channel filter according to an embodiment of the present invention. In particular, FIG. 12 illustrates the frequency response of the channel filter 321 with a factor of 1, FIG. 13 illustrates the frequency response of the channel filter 325 with a factor of ½, FIG. 14 illustrates the frequency response of the channel filter 329 with a factor of ¼, and FIG. 15 illustrates the frequency response of the channel filter 333 with a factor of ⅛.

For a 3 MHz channel bandwidth at the receiver unit, channel filtering may be realized using a single-stage channel filter having a frequency response as shown in FIG. 11. 319 taps are required for realizing the single-stage channel filter.

As described in connection with FIG. 3, channel filtering according to an embodiment of the present invention may be realized using a multistage channel filter composed of four channel filters having frequency responses as shown in FIGS. 12 to 15. When the multistage channel filter is implemented using the channel filters 321, 325, 329 and 333, the number of required filter taps is reduced to 110. As a result, the number of required multipliers can be reduced.

For example, as in the case of the transmitter unit, the number of multipliers can be further reduced by the use of the half-band filter characteristics. For a 3 MHz channel bandwidth at the receiver unit, whereas 319 multipliers are necessary for the single-stage channel filter, only 80 multipliers are necessary for the multistage channel filter. Therefore, the number of multipliers can be reduced by 75 percent.

Considering both the DUC 120 and DDC 220, for a 3 MHz channel bandwidth, whereas 800 multipliers are necessary for single-stage channel filtering, only 180 multipliers are necessary for multistage channel filtering. Therefore, the number of multipliers can be reduced by 77 percent.

Reduction of the number of multipliers through multistage channel filtering according to an embodiment of the present invention is described in Table 2, Table 3 and Table 4.

TABLE 2

| Ch. BW (MHz) | Single stage | Multistage Number of Filter Taps | Number of Multipliers | Comparison |
|---|---|---|---|---|
| 20 | 61 | 61 (×1) = 61 | 61 = 61 | 100% |
| 10 | 121 | 31(×1) + 61(×½) = 92 | 17 + 61 = 78 | 64% |
| 5 | 241 | 15(×1) + 31(×½) + 61(×¼) = 107 | 9 + 17 + 61 = 87 | 35% |
| 3 | 481 | 11(×1) + 15(×½) + 43(×¼) + 61(×⅛) = 130 | 7 + 9 + 23 + 61 = 100 | 21% |
| 1.4 | 353 | 7(×1) + 11(×½) + 15(×¼) + 43(×⅛) + 23(×1/16) = 99 | 5 + 7 + 9 + 23 + 23 = 67 | 19% |

TABLE 3

| Ch. BW (MHz) | Single stage | Multistage Number of Filter Taps | Number of Multipliers | Comparison |
|---|---|---|---|---|
| 20 | 75 | 75(×1) = 75 | 61 = 61 | 100% |
| 10 | 131 | 31(×1) + 67(×½) = 98 | 17 + 67 = 84 | 64% |
| 5 | 263 | 15(×1) + 31(×½) + 61(×¼) = 107 | 9 + 17 + 61 = 87 | 33% |
| 3 | 319 | 11(×1) + 15(×½) + 43(×¼) + 41(×⅛) = 110 | 7 + 9 + 23 + 41 = 80 | 25% |
| 1.4 | 287 | 7(×1) + 11(×½) + 15(×¼) + | 5 + 7 + 9 + 23 + 19 = 63 | 22% |

TABLE 3-continued

| Ch. BW (MHz) | Single stage | Multistage Number of Filter Taps | Number of Multipliers | Comparison |
|---|---|---|---|---|
| | | 43(×⅛) + 19(×1/16) = 95 | | |

TABLE 4

| Ch. BW (MHz) | Single stage | | | Multi stage | | | Comparison |
|---|---|---|---|---|---|---|---|
| | Tx | Rx | Tx + Rx | Tx | Rx | Tx + Rx | |
| 20 | 61 | 75 | 136 | 61 | 75 | 136 | 100% |
| 10 | 121 | 131 | 252 | 78 | 84 | 162 | 64% |
| 5 | 241 | 263 | 504 | 87 | 87 | 174 | 35% |
| 3 | 481 | 319 | 800 | 100 | 80 | 180 | 23% |
| 1.4 | 353 | 287 | 640 | 67 | 63 | 130 | 20% |

Table 2 illustrates the number of filter taps and multipliers and reduction of the number of multipliers for the DUC 120. Table 3 illustrates the number of filter taps and multipliers and reduction of the number of multipliers for the DDC 220. Table 4 illustrates reduction of the number of multipliers for the DUC 120 and DDC 220.

Tables 2 to 4 indicate that the number of multipliers necessary for multistage filtering is less than that the number of multipliers necessary for single-stage filtering. For example, for channel bandwidths of 20, 10, 5, 3 and 1.4 MHz, multistage filtering can be realized using 100, 64, 35, 23 and 20 percent of multipliers necessary for single-stage filtering, respectively.

In comparison to single-stage filtering, multistage filtering with a reduced number of multipliers does not result in degradation of Power Spectral Density (PSD) at the edge of a channel bandwidth.

FIGS. 16 to 19 illustrate power spectral densities of channel filtering according to an embodiment of the present invention.

Figure 16:
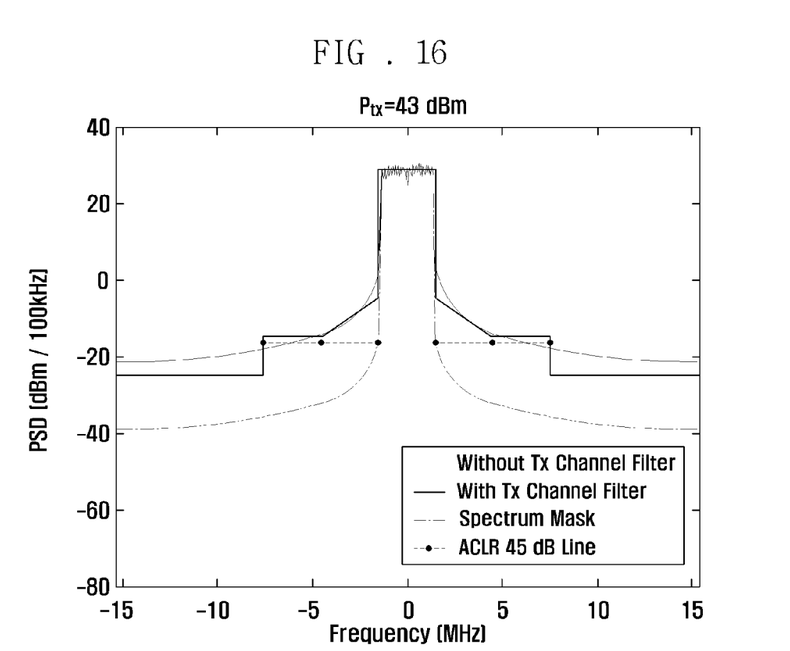
FIGS. 16 and 17 illustrate a power spectral density at the edge of channel bandwidths for the transmitter unit employing a single-stage channel filter.
Figure 17:
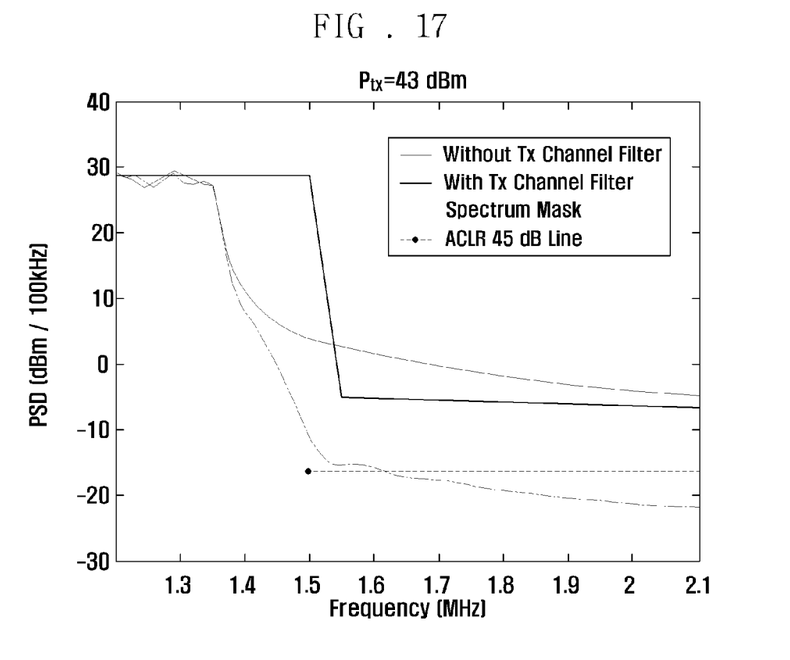

FIGS. 16 and 17 illustrate the power spectral density at the edge of channel bandwidths for the transmitter unit 100 employing a single-stage channel filter. In particular, FIG. 17 shows a graph enlarged at the edge of the channel. In FIGS. 16 to 19, "ACLR" refers to an Adjacent Channel Leakage Ratio.

Figure 18:
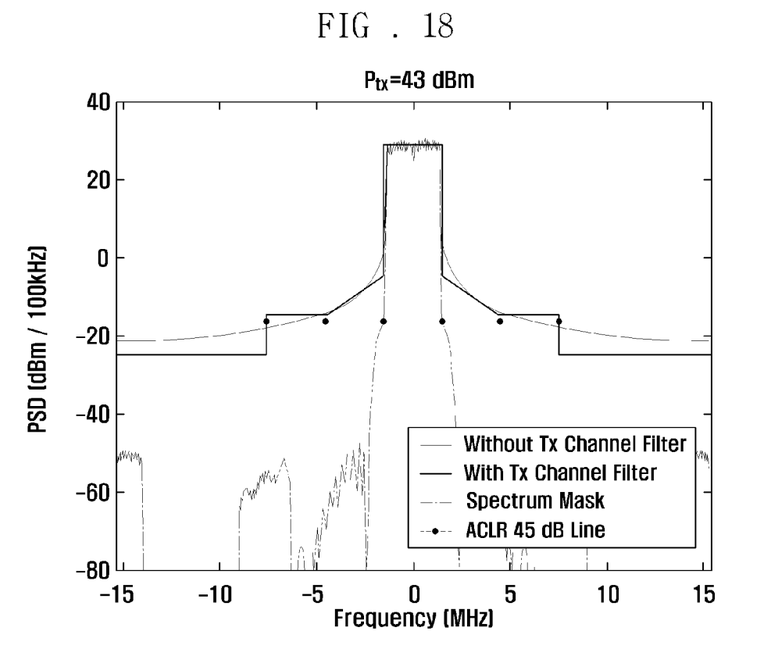
FIGS. 18 and 19 illustrate a power spectral density at the edge of channel bandwidths for the transmitter unit employing a multistage channel filter.
Figure 19:
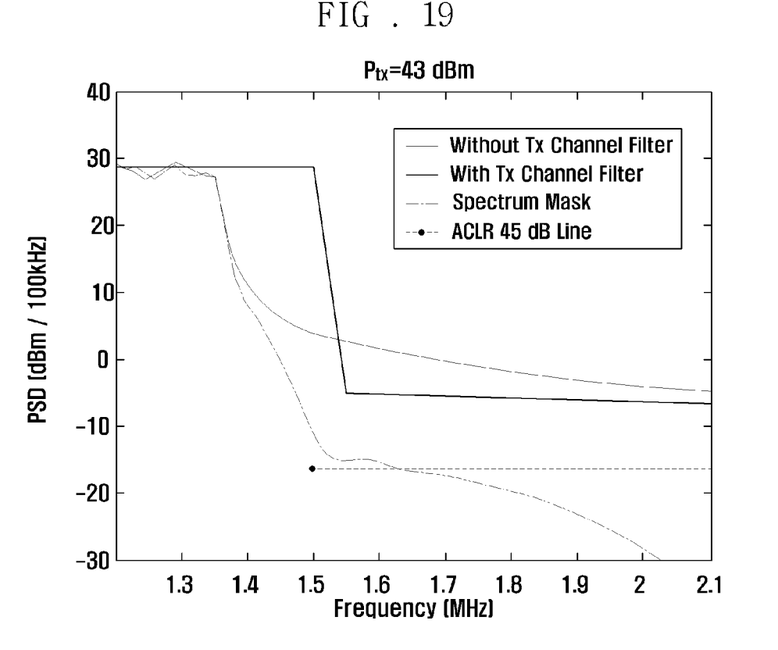

FIGS. 18 and 19 illustrate the power spectral density at the edge of channel bandwidths for the transmitter unit 100 employing a multistage channel filter. In particular, FIG. 19 shows a graph enlarged at the edge of the channel.

FIGS. 16 to 19 indicate that multistage channel filtering results in the same PSD characteristics at the edge of a channel bandwidth as those of single-stage channel filtering.

As apparent from the above description, according to the present invention, the number of filter taps necessary for channel filtering is reduced. Therefore, implementation complexity of the transceiver can be reduced and the channel filter becomes operable at lower clock frequencies. In addition, the DUC 120 of the transmitter unit 100 and the DDC 220 of the receiver unit 200 can maintain the same interface data rate (for example, 30.72 MSPS for 3 MHz). Further, heat dissipaters can be miniaturized due to a reduction of the number of multipliers and a reduction of power consumption.

Although embodiments of the present invention have been described in detail hereinabove, it should be understood that many variations and modifications of the basic inventive concept herein described, which may appear to those skilled in the art, will still fall within the spirit and scope of the embodiments of the present invention as defined in the appended claims.

What is claimed is:

1. A transmitter unit for a wireless communication system, the transmitter unit comprising a multistage channel filter module for performing channel filtering on an input signal having a sampling rate corresponding to a channel bandwidth of the wireless communication system by performing a sampling-rate conversion through multiple stages,
    wherein the multistage channel filter module comprises:
    at least one decimator for down sampling the input signal according to the channel bandwidth;
    at least one zero-padder for interpolating the down-sampled signal according to the channel bandwidth; and
    at least one channel filter for channel-filtering the down-sampled signal or the interpolated signal;
    wherein the transmitter unit further comprising a channel filter adjuster for changing a number and arrangement of the at least one decimator, the at least one zero-padder, and the at least one channel filter according to the channel bandwidth.

2. A receiver unit for a wireless communication system, the receiver unit comprising a multistage channel filter module for performing channel filtering on an input signal having a sampling rate corresponding to a channel bandwidth of the wireless communication system by performing a sampling-rate conversion through multiple stages
    wherein the multistage channel filter module comprises:
    at least one decimator for down sampling the input signal according to the channel bandwidth;
    at least one zero-padder for interpolating the down-sampled signal according to the channel bandwidth; and
    at least one channel filter for channel-filtering the down-sampled signal or interpolated signal;
    wherein the receiver further comprising a channel filter adjuster for changing a number and arrangement of the at least one decimator, the at least one zero-padder, and the at least one channel filter according to the channel bandwidth.

3. A transmitting method for a wireless communication system, the method comprising:
    performing, by a multistage channel filter module, channel filtering on an input signal having a sampling rate corresponding to a channel bandwidth of the wireless communication system by performing a sampling-rate conversion through multiple stages,
    wherein performing the channel filtering comprises:
    down sampling, by at least one decimator, the input signal according to the channel bandwidth;
    interpolating, by at least one zero-padder, the down-sampled signal according to the channel bandwidth; and
    channel-filtering, by at least one channel filter, the down-sampled signal or the interpolated signal;
    wherein the transmitting method further comprising changing, by a channel filter adjuster, a number and arrangement of the at least one decimator, the at least one zero-padder, and the at least one channel filter according to the channel bandwidth.

4. A receiving method for a wireless communication system, the method comprising:
    performing, by a multistage channel filter module, channel filtering on an input signal having a sampling rate corresponding to a channel bandwidth of the wireless communication system by performing a sampling-rate conversion through multiple stages, wherein performing the channel filtering comprises:
down sampling, by at least one decimator, the input signal according to the channel bandwidth;
interpolating, by at least one zero-padder, the down-sampled signal according to the channel bandwidth; and
channel-filtering, by at least one channel filter, the down-sampled signal or interpolated signal;
wherein receiving method further comprising changing, by a channel filter adjuster, a number and arrangement of the at least one decimator, the at least one zero-padder, and the at least one channel filter according to the channel bandwidth.

* * * * *